(12) United States Patent
McClure

(10) Patent No.: US 6,294,939 B1
(45) Date of Patent: Sep. 25, 2001

(54) DEVICE AND METHOD FOR DATA INPUT BUFFERING

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/183,595

(22) Filed: Oct. 30, 1998

(51) Int. Cl.[7] ............................ H03K 3/017; H03K 5/04; H03K 7/08
(52) U.S. Cl. ............................ 327/172; 327/211; 327/34; 327/379
(58) Field of Search .................................. 327/24, 26, 34, 327/36, 172, 379, 384, 385

(56) References Cited

U.S. PATENT DOCUMENTS

| | | | |
|---|---|---|---|
| 3,641,370 | * | 2/1972 | Heimbigner ........................ 327/172 |
| 4,320,515 | | 3/1982 | Burton, Jr. ........................ 375/215 |
| 4,525,635 | * | 6/1985 | Gillberg ........................ 327/34 |
| 4,657,123 | * | 4/1987 | Sakakiyama ........................ 192/3.58 |
| 4,757,214 | * | 7/1988 | Kobayashi ........................ 327/172 |
| 4,825,102 | * | 4/1989 | Iwasawa et al. ........................ 327/546 |
| 4,843,596 | | 6/1989 | Miyatake et al. ........................ 365/233.5 |
| 4,877,980 | | 10/1989 | Kubinec ........................ 327/110 |
| 5,124,584 | * | 6/1992 | McClure ........................ 326/93 |
| 5,289,060 | * | 2/1994 | Elnashar et al. ........................ 327/552 |
| 5,301,165 | | 4/1994 | Ciraula et al. ........................ 365/233.5 |
| 5,448,529 | | 9/1995 | Reddy et al. ........................ 365/233.5 |
| 5,598,095 | * | 1/1997 | Schnaitter ........................ 323/315 |
| 5,696,463 | * | 12/1997 | Kwon ........................ 327/172 |
| 5,732,032 | * | 3/1998 | Park et al. ........................ 365/201 |
| 5,760,612 | | 6/1998 | Ramirez ........................ 327/34 |
| 5,815,016 | * | 9/1998 | Erickson ........................ 327/158 |
| 5,955,906 | | 9/1999 | Yamaguchi ........................ 327/259 |
| 6,073,246 | * | 6/2000 | Song et al. ........................ 713/401 |

\* cited by examiner

Primary Examiner—Terry D. Cunningham
Assistant Examiner—Quani Tra
(74) Attorney, Agent, or Firm—Theodore E. Galanthay; Lisa K. Jorgenson; Andre Szuwalski

(57) ABSTRACT

A substantially noise-free data input buffer for an asynchronous device, such as a static random access memory (SRAM). The input buffer generates either a logical true or complement output signal representation of a data input signal and includes timing circuitry to delay an edge transition on the output signal for a predetermined period of time in response to a signal edge transition appearing on the data input signal. The input buffer further includes edge transition detection (ETD) circuitry for generating an initialization signal in response to the generation of the data output signal.

31 Claims, 3 Drawing Sheets

DEVICE AND METHOD FOR DATA INPUT BUFFERING

BACKGROUND OF THE INVENTION

Semiconductor memories, such as random access memories (RAMs) and read-only memories (ROMs), are typically designed to operate in response to input signals in either a synchronous (clocked) or an asynchronous (unclocked) manner. One type of integrated circuit which operates primarily on asynchronous signals is a static random-access memory (SRAM). An SRAM device is designed to receive data values at data input terminals, and to statically provide the data values to memory cells corresponding to the value of the address applied to the SRAM, without relying on a clock signal indicating that the value at its data input terminals is valid.

Many modern SRAMs now include edge transition detection (ETD) circuits and other timing and control circuits that provide the SRAM device with performance benefits of internal dynamic operation. An ETD circuit detects transitions within the device and generates internal signals or "pulses" responsive to detecting such transitions. The internally-generated ETD pulses are employed to initialize the SRAM for commencement of a memory read or write cycle.

For example, the use of an ETD circuit allows the SRAM circuit to perform certain internal operations, such as pre-charging bit lines or deselecting sense amplifiers, after detection of an input signal transition. Upon presentation of new set of data to the SRAM, the transitions at the data input terminal cause the ETD circuit to enable the necessary functions of the SRAM in order to write the new data values into the addressed memory cells. An example of an ETD circuit used in SRAMs is described in U.S. Pat. No. 5,124,584, issued on Jun. 23, 1993, assigned to SGS-Thomson Microelectronics and herein incorporated by reference.

Conventional ETD circuitry is not without its shortcomings. For instance, an ETD pulse generated by the ETD circuitry which is utilized to initialize an SRAM device may possess a pulsewidth which is drastically reduced and in some cases eliminated due to input glitches appearing on the data input bus. In addition, ETD circuitry is typically separate and distinct from data input buffer circuitry, thereby increasing silicon layout overhead.

Noise or other interference may appear on an input data bus coupled to an SRAM device which may unexpectantly place the input data bus in an undesirable logic state for a temporary period of time. A noise glitch appearing on an input data bus of a conventional SRAM device may propagate therein and cause the wrong data values to be stored in the SRAM device.

Accordingly, there is a need for a data input buffer device and method for an SRAM for preventing noise appearing on a data input bus from adversely effective data storage and for generating edge transition detection signals with little overhead.

SUMMARY OF THE INVENTION

The present invention overcomes shortcomings associated with asynchronous devices and satisfies a need for an input buffer circuit which substantially eliminates the adverse effects of noise and efficiently generates ETD signals for initializing an SRAM or other asynchronous device.

According to the present invention, there is provided a data input buffer device and method for an asynchronous device, such as an SRAM. The data input buffer device preferably receives an input data bus and generates a logic true or logic complement output signal representative thereof for use by circuitry to which the data input buffer device is coupled, such as control and I/O circuitry for the SRAM device. In order to prevent noise appearing on an input data signal from undesirably overwriting data being stored in a memory cell, the data input buffer circuit preferably includes timing circuitry which filters out noise glitches appearing on the data input bus having a relatively narrow pulsewidth and generates a data output signal having rising and falling edge transitions which occur a predetermined period of time following an edge transition appearing on the data input signal. The timing circuitry preferably includes dual circuit paths wherein a first circuit path generates a first delayed timing signal responsive to a falling edge transition appearing on the data input signal, and a second circuit path generates a second delay timing signal responsive to a rising edge transition appearing thereon. The first and second delayed timing signals trigger a falling edge transition and a rising edge transition on the data output signal, respectively, such that the delay to a rising edge transition appearing on the data output signed is substantially equal to the delay to a falling edge transition thereon, relative to a transition on the data input signal.

The above-mentioned timing circuitry of the data input buffer device is efficiently utilized to additionally detect an edge transition appearing on the data input signal and generate an edge transition detection pulse to initialize the SRAM device for preparation of a new memory cycle, such as a memory read or write operation. By generating the edge transition detection pulse from the timing circuitry that generates the data output signal representation of the input data signal, a relatively sizeable amount of silicon space is saved.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENT

Figure 1:
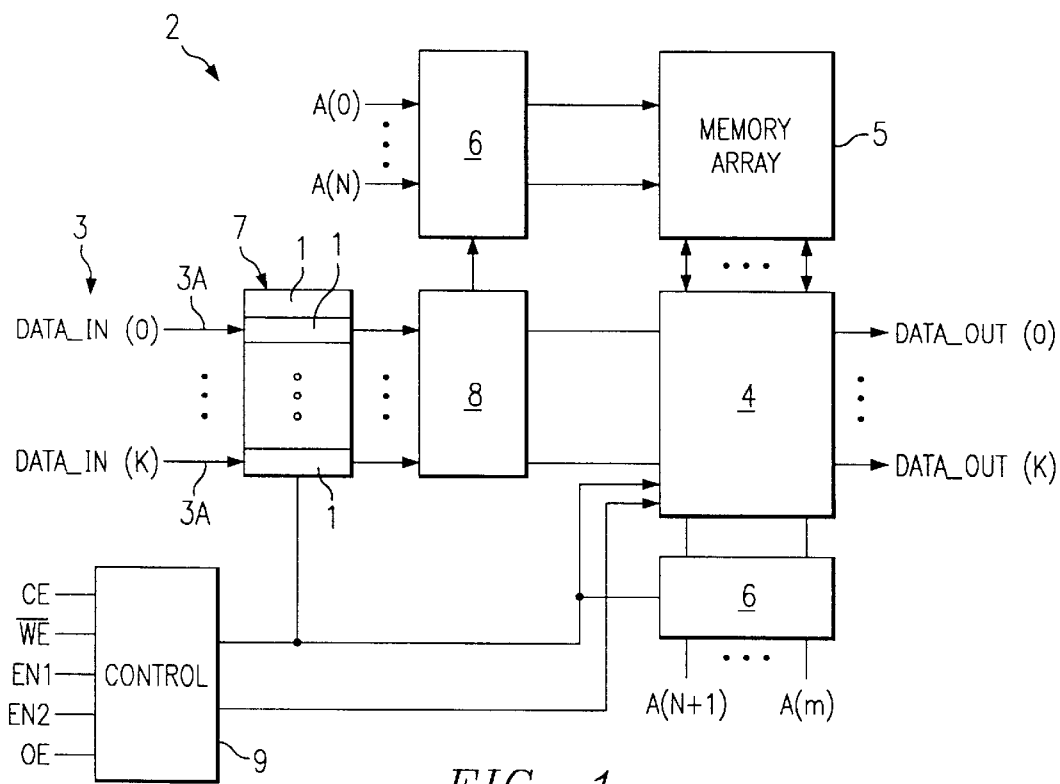
FIG. 1 is a block diagram of the present invention in conjunction with an SRAM device.

Referring to FIGS. 1–4, there is shown a data input buffer 1 circuit in accordance with a preferred embodiment of the present invention. Data input buffer 1 is suitably employed in an asynchronous device, such as an asynchronous static random access memory (SRAM) device 2 as shown in FIG. 1. In this context, data input buffers 1 receive a data bus 3, condition the data bus 3 and generate signals that can be used to drive the column I/O line circuitry 4 for use in writing data into memory cells in memory array 5. SRAM device 2 may additionally include memory control circuitry 9 and row and column decode circuitry 6. As shown in FIG. 1, a number of data input buffers 1 may be combined in a group 7 in order to provide suitable buffering for each bit of data bus 3. It is understood that data input buffer 1 is shown in association with an SRAM device for exemplary purposes only, and that data buffer 1 may be used in other asynchronous devices as well.

Data input buffer 1 preferably generates either a true or complement output signal representation of a data input bit 3A from data input bus 3. In a preferred embodiment, data input buffer 1 generates data input buffer output signal out_comp 10 (FIG. 2) is a boolean complement representation of data input bit 3A.

Data input buffer 1 preferably includes circuitry to avoid a noise glitch from propagating throughout the device with which data input buffer 1 is associated. For use in an SRAM device, a small glitch appearing on data input bit 3A may result in a glitch appearing on a bit or column I/O line of SRAM device 2, thereby resulting in incorrect data potentially being stored in memory array 5. Accordingly, data input buffer 1 includes timing circuitry 13 for providing glitch tolerant output signal out_comp 10.

Timing circuitry 13 preferably provides a delayed response appearing on output signal out_comp 10 relative to an edge transition appearing on data input bit 3A, such that the delay to a rising edge transition on output signal out_comp 10 is substantially the same as the delay to a falling edge transition thereon, relative to an edge transition appearing on data input bit 3A. Timing circuit 13 preferably employs dual circuit paths 14 and 15 for generating output signal out_comp 10. Circuit paths 14 and 15 preferably employ substantially identical circuits and have substantially identical time delays therethrough. Each circuit path of dual circuit paths 14 and 15 generates a delayed signal for effecting either a rising edge transition or a falling edge transition on data output signal 10.

Figure 3:
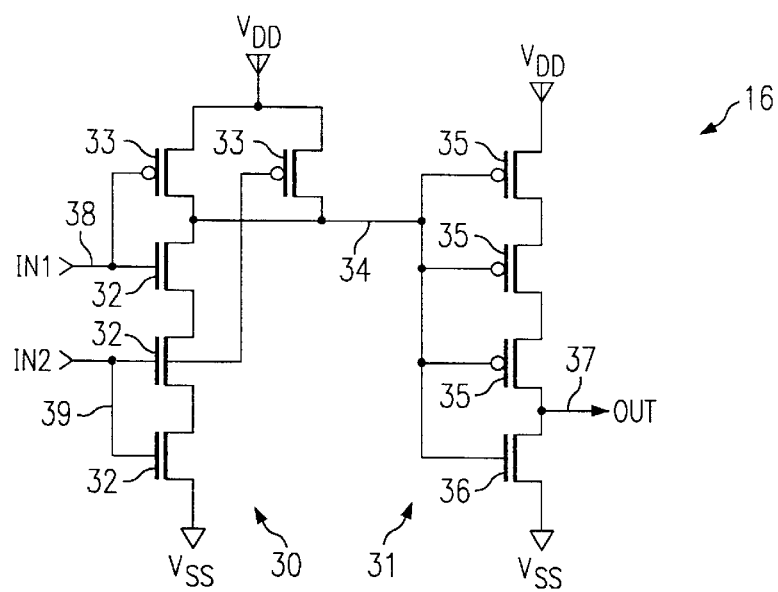
FIG. 3 is a circuit diagram of a delay element according to a preferred embodiment of the present invention.

Circuit path 14 includes delay elements 16A and 16B which provide different propagation delay times between a falling edge transition and a rising edge transition appearing on its output. As shown in FIG. 3, delay element 16 comprises a transistor circuit in which current is forced to flow through a stack of series-connected transistors to electrically connect an output to one reference voltage source and at most one transistor to electrically connect the output to a second reference voltage source. By providing two cascaded circuits 30 and 31 which are each configured in this manner, a significant delay differential is created between a delay from an input edge transition to an output rising edge transition and a delay from an input edge transition to an output falling edge transition.

Referring to FIG. 3, circuit 30 of delay element 16 comprises a two input NAND gate in which three pull-down devices 32 are arranged in a stacked relation and two pull-up devices 33 are arranged in a parallel relation. As a result, the falling edge delay for NAND gate output signal 34 is greater that its rising edge delay.

Circuit 31 of delay element 16 comprises an inverter gate having three pull-up devices 35 connected in series with one pull-down device 36. Consequently, the inverter output signal 37 has a rise time delay which is greater than its fall time delay.

As can be seen, delay element 16 comprises a two-input AND gate in which a falling edge transition appearing on either input signal IN1 38 or IN2 39 quickly creates a falling edge transition appearing on output signal OUT 37, and a rising edge transition appearing on either input signal IN1 38 or IN2 39 creates a rising edge transition which is substantially delayed relative to the input rising edge transition.

Figure 2:
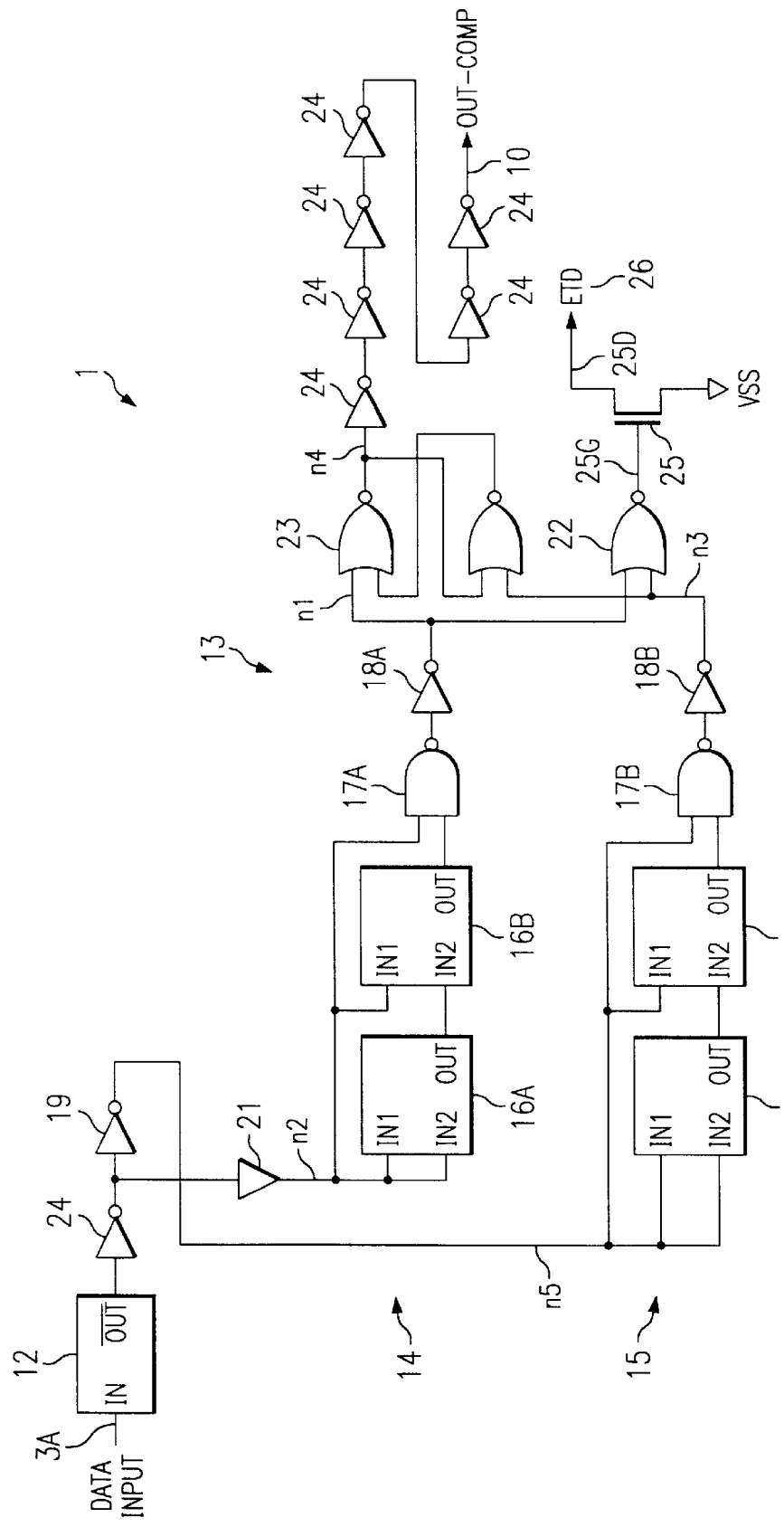
FIG. 2 is a circuit diagram of a preferred embodiment of the present invention.
Figure 4:
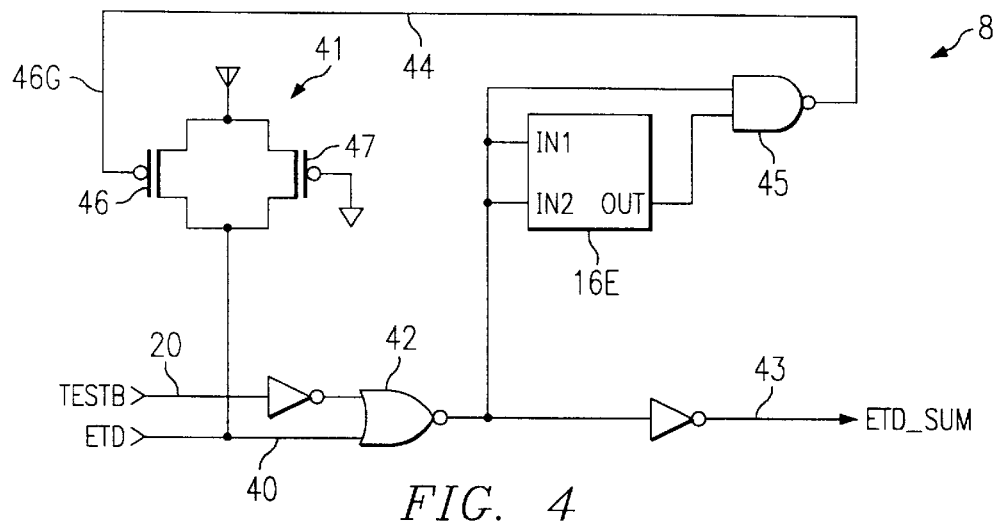
FIG. 4 is a circuit diagram of edge transition detection circuitry in accordance with a preferred embodiment of the present invention.

Referring again to FIG. 2, circuit path 14, which generates a logical true representation of data input bit 3A at internal node n1 for generation of output signal out_comp 10, includes two delay elements 16A and 16B connected in series in which an output of delay element 16A drives an input of delay element 16B. The output of delay element 16B drives a first input of two-input NAND gate 17A, with the second input thereof also being an input into delay elements 16A and 16B. The output of NAND gate 17A is inverted by inverter gate 18A, the output of which is node n1. The combination of delay elements 16A and 16B, NAND gate 17A and inverter 18A as shown in FIG. 2 provides roughly the identical operation as an individual delay element 16, with a primary difference being that the delay to a rising edge transition for the output of inverter 18A (node n1) from the input of delay element 16A is over twice as large as the delay to an output signal rising edge transition through an individual delay element 16. As a result, a delay between a rising edge transition appearing on data input bit 3A and a rising edge transition appearing on node n1 is substantially greater than the delay between a falling edge transition appearing on data input bit 3A and a falling edge transition appearing on node n1.

Circuit path 14 prevents a relatively narrow, positive-going noise glitch (a noise pulse which transitions from the logic low state) appearing on internal node n2 from propagating to node n1 because the rising edge delay through delay elements 16A and 16B will not present a logic high level to NAND gate 17A until a sizeable period of time following the noise glitch appearing on node n2. So long as the rising edge delay through delay elements 16A and 16B is greater than the noise glitch pulsewidth, the noise glitch appearing on node n2 is canceled at NAND gate 17A.

Similarly, circuit path 14 prevents a relatively narrow, negative going noise glitch (a noise pulse which transitions from the logic high state) appearing on node n2 from propagating to node n1 as a complete pulse because the rising edge delay through delay elements 16A and 16B, following a relatively fast falling edge delay therethrough, will not present a logic high level to NAND gate 17A until a sizeable period of time following the noise glitch pulsewidth appearing on node n2.

Circuit path 15, which generates a logical complement representation of data input bit 3A at internal node n3 that is used to generate output signal out_comp 10, is roughly the same as circuit path 14 that generates internal node n1, with the exception being circuit path 15 includes inverter 19. Delay gate 21, such as a turned-on transmission gate, is employed in circuit path 14 to substantially equalize the delay through circuit paths 14 and 15. Due to the presence of inverter 19 in circuit path 15, a delay between a falling edge transition appearing on data input bit 3A and a rising edge transition appearing on node n3 is substantially greater than the delay between a rising edge transition appearing on data input bit 3A and a falling edge transition appearing in node n3. Further, the delay from an edge transition appearing on input data bit 3A to a falling edge transition appearing on node n1 is substantially the same as the delay from an edge transition appearing on input data bit 3A to a falling edge transition appearing on node n3. In addition, the delay from an edge transition appearing on input data bit 3A to a rising edge transition appearing on node n1 is substantially the same as the delay from an edge transition appearing on input data bit 3A to a rising edge transition appearing on node n3.

It is understood that circuit paths 14 and 15 may utilize any number of cascaded delay elements 16 in order to create the desired delay differential between the rising and falling edge transition times for internal nodes n1 and n3.

Data input buffer 1 further includes an input buffer 12 for receiving data input bit 3A. Input buffer 12 may further suitably condition data input bit 3A in the event the voltage levels for data input bit 3A do not operatively match the necessary voltage levels for data input buffer circuitry 1.

Data input buffer 1 preferably further includes latch element 23. Latch element 23 preferably is an unclocked S-R latch which provides a Q' output (node n4) which is set to a logic low level whenever a rising edge transition appears on node n1 (the noise-free, logical true representation of data input bit 3A). Conversely, latch element 23 preferably provides a Q' output which is set to a logic high level whenever a rising edge transition appears on node n3 (the noise-free, logical complement representation of data input bit 3A) and node n1 is at a logic low level. Rising and falling edge transitions on data input bit 3A cause rising edge transitions on nodes n1 and n3, respectively. The rising edge transitions appearing on nodes n1 and n3 thereupon cause node n4 (the Q' output of latch element 23) to toggle to a logic level low and logic level high state, respectively. In this way, node n4 is a substantially glitch-free signal which is a logical complement of data input bit 3A. Node n4 is employed to provide output signal out_comp 10.

As can be seen, due to the substantially equal rising (triggering) edge propagation delay through circuit paths 14 and 15, the delay from an edge transition appearing on data input bit 3A to a rising edge transition appearing on output signal out_comp 10 is substantially the same as the delay from an edge transition appearing on data input bit 3A to a falling edge transition appearing on output signal out_comp 10.

Further, it is noted that nodes n1 and n3 are both placed in a logic low or deasserted state prior to the occurrence of an asserting or triggering (rising) edge transition appearing on either of nodes n1 and n3. The timing associated with asserting nodes n1 and n3 is controlled to enable an activity and in particular to decouple the asserting edge transitions on nodes n1 and n3 from the deasserting edge transitions thereof. In this case, the asserting edge transitions appearing on nodes n1 and n3 occur at a time period td after the corresponding deasserting edge transitions. As a result, noise glitches or other race conditions are substantially prevented from propagating throughout the asynchronous device to which the present invention is coupled. Decoupling of edge transitions between nodes n1 and n3 additionally reduces the magnitude of switching currents in the circuitry which generate and are affected by nodes n1 and n3.

Data input buffer 1 may preferably include a chain of inverter gates 24 which is disposed between node n4 and output signal out_comp 10. Inverter gates 24 further delay the signal path from data input bit 3A to output signal out_comp 10 in order to provide sufficient hold time for data input bit 3A, in the event input buffer circuit 1 is associated with an asynchronous memory device, such as SRAM 2.

As stated above, data input buffer 1 may be associated with or be a part of a variety of different devices. In the event that data input buffer 1 is connected to and/or a part of an asynchronous device, such as an SRAM device, data input buffer 1 may preferably include edge detection circuitry to detect an edge appearing on data input bit 3A. The edge detection circuitry, upon detecting an edge transition appearing on data input bit 3A, generates a pulse which initiates a reset and/or initialization operation. In the context of data input buffer 1 being part of an asynchronous SRAM device as shown in FIG. 1, the edge detection circuitry may initiate a memory cycle, including the precharging and equilibrating of the bit lines of bit line pairs, etc. Edge detection circuitry for data input bus 3 of SRAM 2 may be particularly important if SRAM 2 is a low power device which may be configured in an idle state during a portion of a memory cycle in order to reduce power dissipation. In the event a new data value appears on data input bus 3 during the idle portion of a memory write cycle, SRAM 2 must be awakened from its idle state in order to write the new data value into memory. The edge detection circuitry of the present invention detects an edge transition appearing on data input bus 3 to ensure data is suitably stored in SRAM 2.

Data input buffer 1 advantageously utilizes circuitry for generating output signal out_comp 10 to generate an edge detection pulse signal ETD 26. As shown in FIG. 2, edge detection circuitry comprises two-input NOR gate 22 and pull-down device 25. Internal nodes n1 (the glitch-free, logical true representation of data input bit 3A) and n3 (the glitch-free, logical complement representation of data input bit 3A) are preferably connected to the input of NOR gate 22, the output of which is connected to the control or gate electrode 25G of pull-down transistor 25. The drain electrode 25D of pull-down transistor 25 (signal ETD 26) may be used in a wired-nor configuration by being connected to other edge transition detection pull-down devices 25 and to a single pull-up device.

In this regard, the present invention preferably further includes a summing circuit 8 (FIG. 4) which is coupled to the drain electrode 25D of pull-down device 25 of each data input buffer circuit 1 and generates a single edge transition detection signal pulse for use in resetting and/or initializing SRAM 2 to commence a memory cycle. Specifically, the drain 25D of pull-down device 25 of each data input buffer circuit 1 is electrically connected together. Pull-up device 41 is connected to provide a wired-nor configuration with pull-down devices 25, such that when any pull-down device 25 is activated node 40 is pulled towards the low reference voltage level. Signal ETD 26 is gated with the logical inversion of a test mode signal TestB 20 at NOR gate 42, the output of which is then inverted to generate active low output signal etd_sum 43. Output summing signal etd_sum 43 is the signal which is fed to the SRAM device 2 to initialize SRAM device 2 for the commencement of a memory cycle. Signal etd_sum 43 provides an active low pulse having a pulsewidth which is defined by the difference in delays between a rising edge transition and a falling edge transition propagating through circuit paths 14 and 15.

Summing circuit 8 preferably further includes feedback control circuity 44 to control the impedance level of pull-up device 41. Feedback control circuitry 44 comprises delay element 16E whose input is connected to the output of NOR gate 42. The output of delay element 16E drives a first input of NAND gate 45 and the output of NOR gate 42 drives a second input thereof. This combination of delay element 16E and NAND gate 45 provides a logically inverted signal of the output of NOR gate 42 in which the rising edge of the output of NAND gate 45 occurs relatively soon after the occurrence of a rising edge transition appearing on the output of NOR gate 42. The falling edge of the output of NAND gate 45 occurs a predetermined time period (as determined by the slowed delay through delay element 16E) after the occurrence of a rising edge transition appearing on the output of NOR gate 42.

Pull-up device 41 of summing circuit 8 preferably comprises p-channel transistor 46 and p-channel transistor 47 connected in parallel. Pull-up transistor 47 is preferably sized and biased so as to relatively weakly pull node 40 towards the high reference voltage level. The gate electrode 46G of pull-up transistor 46 is driven by the output of NAND gate 45. By providing feedback to pull-up device 41 with a delayed falling edge transition on gate electrode 46G of pull-up transistor 46, pull-up transistor 46 is activated a period of time following a falling edge transition appears on signal ETD 26. This delayed activation of pull-up transistor 46 reduces crowbar current during the occurrence of a pulse appearing on signal ETD 26.

The operation of data input buffer circuit 1 is as follows. Consider the case wherein a high logic level was previously placed on data input bit 3A at time T0. Node n2 is driven to a high logic level, which is propagated through delay elements 16A and 16B, NAND gate 17A and inverter 18A so that node n1 is driven to a high logic level. Similarly, node n5 is driven to a low logic level, which is propagated through delay elements 16C and 16D, NAND gate 17B and inverter 18B so that node n3 is driven to a low logic level. With node n1 being driven to a high logic level and node n3 to a low logic level, node n4 (Q' of latch element 23) is driven to a low logic level, which causes out_comp 10 to be driven to a low logic level. With node n1 being at a high logic level, pull-down transistor 25 is turned off, so signal ETD 26 is capable of being pulled towards the reference voltage supply by a pull-up device.

When data input bit 3A transitions to a low logic level at time T1, node n2 then transitions from a high logic level to a low logic level and node n5 transitions from a low logic level to a high logic level. With respect to circuit path 14, node n2 transitioning to the low logic level quickly forces the output of NAND gate 17A to the high logic level, after which node n1 is driven to the low logic level at time T2. The output signals of delay elements 16A and 16B are driven to the low logic level fairly quickly after node n2 is driven to the low logic level. However, because the output of NAND gate 17A was already driven to the high logic level, the signal propagating through delay elements 16A and 16B has no effect on the transitioning of node n1.

A falling transition appearing on node n1 at time T2 has no effect on the state of latch 23, because latch element 23 is capable of changing state upon a rising edge transition appearing on nodes n1 or n3. Output signal out_comp 10 thus remains latched in the logic low state. Soon after node n1 is driven to the logic low level, the output of NOR gate 22 is driven to a logic high state which activates pull-down transistor 25, thereafter causing output signal ETD 26 to be pulled towards the low reference voltage level shortly after time T2.

Figure 5:
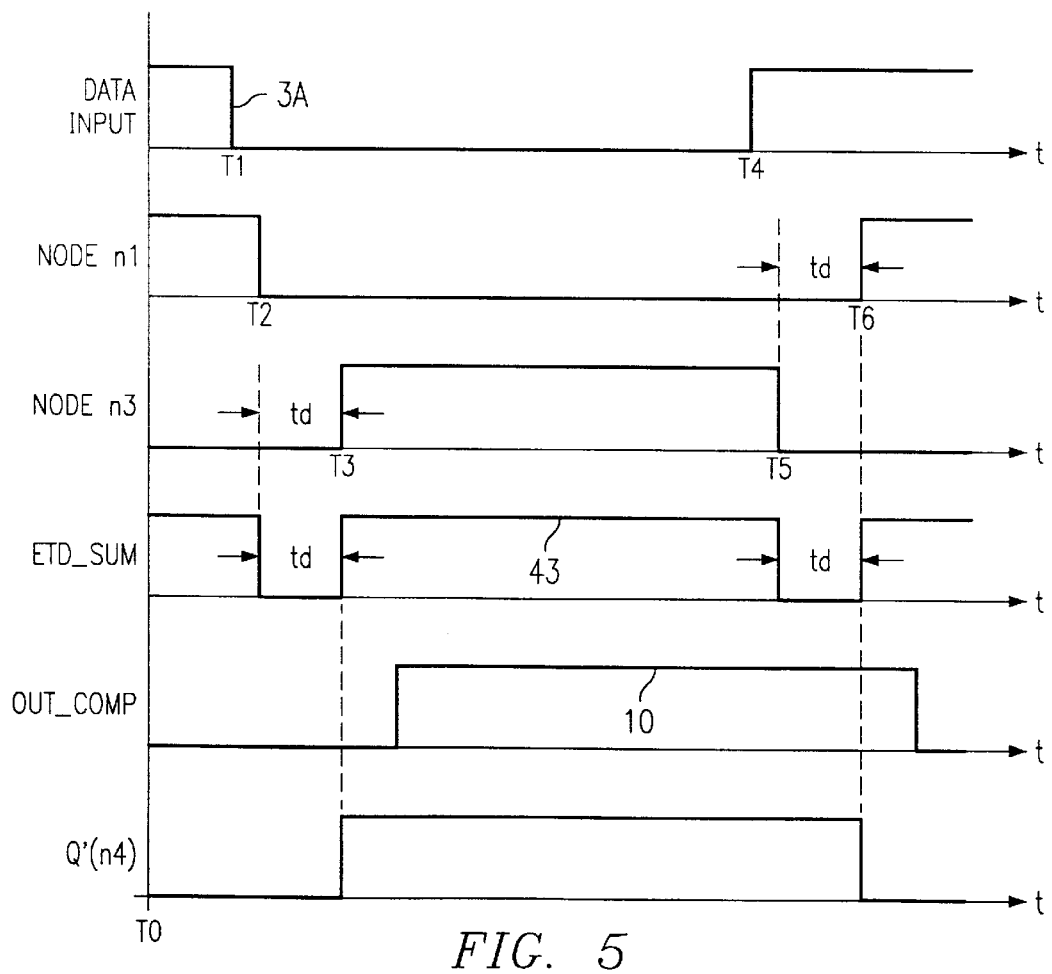
FIG. 5 is a timing diagram illustrating the operation of the present invention.

With respect to circuit path 15, node N5 transitioning from a low reference level to a high reference voltage level places one input of NAND gate 17B in a logic high state. The rising edge transition of node n5 passes through delay elements 16C and 16D before appearing on the second input of NAND gate 17B. Because of the delay for an output signal rising edge transition for delay elements 16C and 16D, the second input of NAND gate 17B does not transition to a high logic level until an appreciable period of time has elapsed. Eventually, the second input of NAND gate 17B transitions to a high logic level, which causes the output of NAND gate 17B to be driven to the low logic level, after which node n3 is driven to a high logic level at time T3. The effect of delay elements 16 having a fast falling edge delay and a slower rising edge delay is seen in FIG. 5 by the falling edge of node n1 occurring time period td (equaling the time difference between time T3 and time T2) earlier than the rising edge of node n3, in response to an edge transition appearing on data input bit 3A. With node n1 being in the logic low state and a rising edge transition appearing on node n3 at time T3, latch 23 changes state soon after time T3, thereby driving node n4 (the Q' output of latch 23) to the logic high state. Output signal out_comp 10 transitions to the high logic state after the rising edge signal propagates through the chain of inverters 24.

Soon after time T3, the output of NOR gate 22 is driven towards the low reference voltage level, which deactivates pull-down transistor 25 and causes signal ETD 26 and etd_sum 43 to be driven towards the high reference voltage due to the presence of pull-up device 41.

Consider further the case in which data input bit 3A transitions from a low logic level to a high logic level at time T4. Data input bit 3A transitioning from a low logic level to a high logic level causes a falling transition on node n5. The falling transition on node n5 relatively quickly drives the output of NAND gate 17B to a high logic level, after which node n3 is driven to a low logic level at time T5. Because latch element 23 is triggered on a rising edge transition appearing on nodes n1 and n3, a falling edge transition on node n3 maintains latch element 23 in its existing state. Shortly after time T4, signal ETD 26 and signal etd_sum 43 are driven to the low logic level.

Node n2, after the rising edge transition of data input bit 3A propagates through input circuit 12, transitions from a low logic level to a high logic level. The rising edge transition of node n1 appears on a first input of NAND gate 17A. However, the rising transition of node n1 relatively slowly propagates through delay elements 16A and 16B such that a rising edge transition does not appear on the second input of NAND gate 17A until noticeably later, after which the output of NAND gate 17A transitions to the low logic level followed by node n1 having a rising edge transition at time T6. With node n3 at a low logic level and a rising edge transition appearing on node n1, latch element 23 changes state shortly after time T6, thereby driving node n4 to the low logic level. Output out_comp 11 transitions to a low logic level a period of time later defined by chain of inverters 24. With node n1 now at the high voltage level, signals ETD 26 and etd_sum 43 are driven to the logic high state shortly thereafter.

As can be seen from FIG. 5, an edge transition appearing on data input bit 3A, in either direction, causes both nodes n1 and n3 to transition a predetermined time period td apart from each other. The predetermined time period td, in the embodiment shown in FIGS. 1–4, is the difference between a rising edge and a falling edge propagating through circuit paths 14 and 15. Because the triggering (rising) edges of nodes n1 and n3 have substantially equal propagation delay times relative to data input signal 3A, the rising and falling edge propagation delay times for output signal out_comp 10 are substantially identical. Further, data input buffer 1 prevents the pulse appearing on signals ETD 26 and etd_sum 43 from being shortened or eliminated due to any relatively narrow glitches occurring on data input bit 3A. Signals appearing on outputs ETD 26 and etd_sum 43 thus are active low pulses each having a pulsewidth of time td. By incorporating the circuitry which generates signal ETD 26 into circuitry 13, layout overhead in generating edge transistion signal ETD 26 is reduced.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A data input buffer circuit for an asynchronous device, comprising:

a first circuit for asynchronously receiving a data input signal; and a second circuit for asynchronously generating a data output signal representation of the data input signal, the data output signal having a rising edge transition which is delayed a first time delay following a first edge transition appearing on the data input signal, and a falling edge transition which is delayed a second time delay following a second edge transition appearing on the data input signal, wherein the first time delay is substantially the same as the second time delay, the second circuit comprising:

an asynchronous logical true circuit path which generates a logical true representation of the data input signal;

an asynchronous logical complement circuit path which generates a logical complement representation of the data input signal, wherein triggering edge transitions appearing on the logical true representation signal and the logical complement representation signal generate edge transitions appearing on the data output signal; and a latch element responsive to the logical true and logical complement signal representations generated by the logical true and logical complement circuit paths, respectively, the data output signal generated by the second circuit being responsive to an output of the latch element; wherein the logical true and complement signal representations are concurrently placed in a deasserting logic state a period of time prior to a triggering edge transition appearing on either the logical true signal representation or the logical complement signal representation; and the output of the latch element is maintained in a prior state during the period of time the logical true and complement signal representations are concurrently placed in the deasserting logic state.

2. The circuit of claim 1, wherein:

a delay from a rising edge transition appearing on the data input signal to a rising edge transition appearing on the logical true representation of the data input signal generated by the logical true circuit path is substantially greater than a delay from a falling edge transition appearing on the data input signal to a falling edge transition appearing on the logical true representation of the data input signal generated by the logical true circuit path.

3. The circuit of claim 1, wherein:

a delay from a falling edge transition appearing on the data input signal to a rising edge transition appearing on the logical complement representation of the data input signal generated by the logical complement circuit path is substantially greater than a delay from a rising edge transition appearing on the data input signal to a falling edge transition appearing on the logical complement representation of the data input signal generated by the logical complement circuit path.

4. The circuit of claim 1, further including:

a circuit for detecting an edge transition appearing on the data input signal and for generating a pulse responsive to the detection, the circuit for detecting being responsive to the logical true and logical complement representations of the data input signal.

5. The circuit of claim 4, wherein:

the logical true and complement signal representations are concurrently placed in a deasserting logic state for a period of time prior to a triggering edge transition appears on either the logical true signal representation or the logical complement signal representation; and the pulse generated in response to the detection of an edge transition appearing on the data input signal is asserted during the period of time the true and complement signal representations are concurrently placed in the deasserting state.

6. The circuit of claim 4, wherein the circuit for detecting and generating includes:

a pull-down device whose activation is responsive to the logical true and logical complement representations of the data input signal.

7. The circuit of claim 6, wherein the circuit for detecting and generating includes:

a pull-up device connected to the pull-down device and a control circuit for activating the pull-up device a predetermined period of time following activation of the pull-down device.

8. The circuit of claim 1, wherein the second circuit includes:

a timing circuit for substantially preventing a noise glitch appearing on the data input signal from propagating to the data output signal.

9. A method for buffering a data input signal for an asynchronous device, comprising the steps of:

asynchronously receiving the data input signal;

generating logical true and logical complement signals of the data input signal;

placing the logical true and logical complement signals in the same deasserting logic state for a predetermined period of time prior to a triggering edge transition occurring on either the logical true or logical complement signal representations; and asynchronously generating a data output signal, the step of asynchronously generating including the steps of:

maintaining the data output signal in a prior state during the period of time the logical true and logical complement signals are concurrently placed in the deasserting logical state;

transitioning the data output signal to a first logic state following the period of time the logical true and logical complement signals are concurrently in the deasserting state, in response to an edge transition to the first logic state appearing on the logical true signal representation, and latching the data output signal in the first logic state thereafter; and transitioning the data output signal to a second logic state following the period of time the logical true and logical complement signals are concurrently in the deasserting state, in response to an edge transition to the first logic state appearing on the logical complement signal representation, and latching the data output signal in the second logic state thereafter.

10. The method of claim 9, further including the step of:

generating an edge transition detection pulse responsive to the step of generating logical true and logical complement signal representations.

11. The method of claim 9, further including the step of:

substantially preventing noise glitches appearing on the data input signal from propagating to the data output signal during the step of generating the data output signal.

12. The method of claim 9, wherein:

the step of generating logical true and logical complement signal representations includes the step of delaying an edge transition to the first logic state appearing on the logical true and logical complement signal representations by a first delay time following edge transitions appearing on the data input signal.

13. The method of claim 12, wherein:

the step of generating logical true and logical complement signal representations includes the step of delaying an edge transition to a second logic state appearing on the logical true and logical complement signal representations by a second delay time following edge transitions appearing on the data input signal; and the first delay time is substantially larger than the second delay time.

14. The method of claim 9, further including the step of:

generating an edge transition detection pulse responsive to an edge transition appearing on the logical true and logical complement signal representations, wherein the edge transition detection pulse occurs during the predetermined period of time when the logical true and logical complement signal representations are in the same deasserting logic state.

15. An asynchronous device, comprising:

a data input buffer comprising:

a first circuit for receiving a data input signal; and a second circuit for asynchronously generating a data output signal responsive to the data input signal received by the first circuit, the second circuit including asynchronous timing circuitry to delay by approximately a predetermined amount of time each edge transition on the data output signal relative to a corresponding edge transition on the data input signal to prevent noise appearing on the data input signal from appearing on the data output signal;

the asynchronous timing circuit generates a first signal having a triggering edge occurring a first period of time following an edge transition to a first logic state appearing on the data input signal, and a second signal having a triggering edge occurring the first period of time following an edge transition to a second logic state appearing on the data input signal, the data output signal being responsive to the triggering edge of the first and second signals;

the second circuit includes a latch element, the latch element being triggered by the triggering edge of the first signal and the second signal, the data output signal being responsive to the output of the latch element.

16. The asynchronous device of claim 15, wherein:

a non-triggering edge of the first signal occurs a second period of time following an edge transition to the second logic state appearing on the data input signal, the first period of time being substantially longer than the second period of time.

17. The asynchronous device of claim 16, wherein:

a non-triggering edge of the second signal occurs a second period of time following an edge transition to the first logic state appearing on the data input signal, the first period of time being substantially longer than the second period of time.

18. The asynchronous device of claim 17, further including:

a third circuit for generating an edge detection pulse signal, the edge detection pulse signal being responsive to the first signal and the second signal.

19. The asynchronous device of claim 18, wherein:

a width of the edge detection pulse signal is substantially equal to the difference between the first period of time and the second period of time.

20. The circuit of claim 1, wherein:

the logical true and logical complement circuit paths are combinational circuit paths.

21. The asynchronous device of claim 15, wherein:

the asynchronous device comprises an asynchronous memory device.

22. A data input buffer circuit for an asynchronous device, comprising:

a first means for receiving a data input signal;

a second means for generating a data output signal representation of the data input signal, the data output signal having a rising edge transition which is delayed a first time delay following a first edge transition appearing on the data input signal, and a falling edge transition which is delayed a second time delay following a second edge transition appearing on the data input signal, wherein the first time delay is substantially the same as the second time delay, and the wherein the second means includes:

a logical true circuit path which generates a logical true representation of the data input signal; and a logical complement circuit path which generates a logical complement representation of the data input signal;

wherein triggering edge transitions appearing on the logical true representation signal and the logical complement representation signal generate edge transitions appearing on the data output signal; and means for detecting an edge transition appearing on the data input signal and for generating a pulse responsive to the detection, the means for detecting and generating being responsive to the logical true and logical complement representations of the data input signal and including a pull-down device whose activation is responsive to the logical true and logical complement representations of the data input signal and a pull-up device connected to the pull-down device and a control circuit for activating the pull-up device a predetermined period of time following activation of the pull-down device.

23. The data input buffer circuit of claim 22, wherein:

the logical true and complement signal representations are concurrently placed in a deasserting logic state for a period of time prior to a triggering edge transition appears on either the logical true signal representation or the logical complement signal representation; and the pulse generated in response the detection of an edge transition appearing on the data input signal is asserted during the period of time the true and complement signal representations are concurrently placed in the deasserting state.

24. A method for buffering a data input signal for an asynchronous device, comprising the steps of:

receiving the data input signal; and generating a data output signal, the step of generating including the steps of:

transitioning the data output signal to a first logic state a first period of time following a rising edge transition appearing on the data input signal during the step of receiving; and transitioning the data output signal to a second logic state the first period of time following a falling edge transition appearing on the data input signal during the step of receiving;

generating logical true and logical complement signal representations of the data input signal, wherein the step of generating the data output signal is responsive to the step of generating the logical true and logical complement signal representations; and generating an edge transition detection pulse responsive to the step of generating logical true and logical complement signal representations, comprising:

activating a pull-down device responsive to the logical true and logical complement representations of the data input signal; and activating a pull-up device connected to the pull-down device a predetermined period of time following activation of the pull-down device, the edge transition detection pulse appearing on a signal driven by the pull-up and pull-down devices.

25. A method for buffering a data input signal for an asynchronous device, comprising the steps of:

receiving the data input signal; and generating a data output signal, the step of generating including the steps of:

transitioning the data output signal to a first logic state a first period of time following a rising edge transition appearing on the data input signal during the step of receiving; and transitioning the data output signal to a second logic state the first period of time following a falling edge transition appearing on the data input signal during the step of receiving;

generating logical true and logical complement signal representations of the data input signal, wherein the step of generating the data output signal includes the step of triggering a transition on the data output signal in response to an edge transition to a first logic state appearing on the logical true and logical complement signal representations of the data input signal;

placing the logical true and logical complement signals in the same deasserting logic state for a predetermined period of time prior to a triggering edge transition occurring on either the logical true or logical complement signal representations; and generating an edge transition detection pulse responsive to an edge transition appearing on the logical true and logical complement signal representations, wherein the edge transition detection pulse occurs during the predetermined period of time when the logical true and logical complement signal representations are in the same deasserting logic state, the generating comprising the steps of:

activating a pull-down device responsive to the logical true and logical complement signal representations of the data input signal during the predetermined period of time when the logical true and logical complement signal representations are in the same deasserting logic state; and activating a pull-up device connected to the pull-down device a predetermined period of time following activation of the pull-down device and following the predetermined period of time when the logical true and logical complement signal representations are in the same deasserting logic state, the edge transition detection pulse appearing on a signal driven by the pull-up and pull-down devices.

26. A data input buffer, comprising:

first circuit for receiving a data input signal;

second circuit for generating a data output signal responsive to the data input signal received by the first circuit, the second circuit including timing circuitry to delay an edge transition on the data output signal relative to an edge transition on the data input signal to prevent noise appearing on the data input signal from appearing on the data output signal, the timing circuit generates a first signal having a triggering edge occurring a first period of time following an edge transition to a first logic state appearing on the data input signal, the data output signal responsive to the triggering edge of the first signal, and a second signal having a triggering edge occurring the first period of time following an edge transition to a second logic state appearing on the data input signal, the data output signal being responsive to the triggering edge of the second signal; and a third circuit for generating an edge detection pulse signal, the edge detection pulse signal being responsive to the first signal and the second signal, the third circuit including a pull-down device whose activation is responsive to the first and second signals, a pull-up device connected to the pull-down device and a control circuit for activating the pull-up device a predetermined period of time following activation of the pull-down device;

wherein a non-triggering edge of the first signal occurs a second period of time following an edge transition to the second logic state appearing on the data input signal, the first period of time being substantially longer than the second period of time, and a non-triggering edge of the second signal occurs a second period of time following an edge transition to the first logic state appearing on the data input signal, the first period of time being substantially longer than the second period of time.

27. The data input buffer of claim 26, wherein:

a width of the edge detection pulse signal is substantially equal to the difference between the first period of time and the second period of time.

28. The circuit of claim 1, wherein the data output signal transitions one time for each transition appearing on the data input signal.

29. The method of claim 9, wherein the step of transitioning the data output signal to the first logic state comprises:

transitioning the data output signal only to the first logic state following a rising edge transition appearing on the data input signal.

30. The method of claim 9, wherein the step of transitioning the data output signal to the second logic state comprises:

transitioning the data output signal only to the second logic state following a falling edge transition appearing on the data input signal.

31. The device of claim 15, wherein the second circuit causes the data output signal to transition a single time for each transition appearing on the data input signal.

* * * * *